United States Patent [19]

Shishiguchi

[11] Patent Number: 5,821,158

[45] Date of Patent: *Oct. 13, 1998

[54] SUBSTRATE SURFACE TREATMENT METHOD CAPABLE OF REMOVING A SPONTANEOUS OXIDE FILM AT A RELATIVELY LOW TEMPERATURE

[75] Inventor: Seiichi Shishiguchi, Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 703,735

[22] Filed: Aug. 27, 1996

[30] Foreign Application Priority Data

Aug. 28, 1995 [JP] Japan .................................. 7-218773

[51] Int. Cl.$^6$ .................................................. H01L 21/265
[52] U.S. Cl. ........................................ 438/528; 438/974
[58] Field of Search ............................ 437/24, 247, 239, 437/946, 950, 959; 438/528, 974

[56] References Cited

U.S. PATENT DOCUMENTS

| | | | |
|---|---|---|---|
| 4,885,257 | 12/1989 | Matsushita | 437/24 |
| 4,920,076 | 4/1990 | Holland et al. | 437/24 |
| 5,089,441 | 2/1992 | Moslehi | 437/946 |
| 5,145,794 | 9/1992 | Kase et al. | 437/24 |
| 5,229,334 | 7/1993 | Kato | 437/239 |
| 5,250,445 | 10/1993 | Bean et al. | 437/24 |
| 5,296,387 | 3/1994 | Aronowitz et al. | 437/24 |
| 5,298,435 | 3/1994 | Aronowitz et al. | 437/24 |
| 5,470,794 | 11/1995 | Antum et al. | 437/24 |

FOREIGN PATENT DOCUMENTS 5-259091  10/1993  Japan .

OTHER PUBLICATIONS

J. Tsuchimoto et al.;"Effect on in–situ SiH$_4$ added H$_2$ pre–baking for removal of the native SiO$_2$"; 1992; p. 702; Autumnal Conference of Institute of Applied PhysicsEngineers in Japan, 30a–ZH–1.

Primary Examiner—John Niebling
Assistant Examiner—S. Mulpuri
Attorney, Agent, or Firm—Hayes, Soloway, Hennessey, Grossman & Hage, P.C.

[57] ABSTRACT

On treating a substrate surface of a single crystal silicon substrate, Ge ions are preliminarily implanted into the substrate surface to be formed as a Ge-implanted silicon film on the single crystal silicon substrate. A film surface of Ge-implanted silicon film is treated by oxidizing the film surface to form a spontaneous oxide film. Subsequently, the spontaneous oxide film is subjected to a heat treatment in a reduced-pressure atmosphere to remove the spontaneous oxide film. Alternatively, the spontaneous oxide film is subjected to a heat treatment with a reducing gas of, for example, a hydrogen gas, a silane-based gas, or a GeH$_4$ gas supplied onto the spontaneous oxide film to remove the spontaneous oxide film. Preferably, the Ge ions are preliminarily implanted into the substrate surface to be formed as Ge-implanted silicon film which consists, in atomic percent, essentially of at least 1% Ge.

10 Claims, 5 Drawing Sheets

SUBSTRATE SURFACE TREATMENT METHOD CAPABLE OF REMOVING A SPONTANEOUS OXIDE FILM AT A RELATIVELY LOW TEMPERATURE

BACKGROUND OF THE INVENTION

This invention relates to a method of manufacturing a semiconductor device and, in particular, to a method of treating a surface of a semiconductor substrate.

In various processes for manufacturing a semiconductor device such as an ultra large scale integrated (USLI) circuit, removal of a spontaneous oxide film spontaneously formed on a surface of a semiconductor substrate is essential. The spontaneous oxide film will be called a natural oxide film or a native oxide film in the art. For example, in the process of epitaxial growth of silicon on a silicon substrate by chemical vapor deposition (CVD), the spontaneous oxide film spontaneously formed on the silicon substrate must be removed within a growing device or furnace. Manufacture of a dynamic random access memory (DRAM) includes the process of burying a contact hole with polysilicon as a contact plug to form a polysilicon contact which serves to electrically connect a device active layer on the silicon substrate and a conductor layer. In this process also, it is essential to remove the spontaneous oxide film on the surface of the silicon substrate before growth of polysilicon in order to suppress contact resistance. Besides, the process of growing a thin film on the semiconductor substrate requires removal of the spontaneous oxide film on the surface of the substrate before the thin film is formed. This is because the spontaneous oxide film remaining at the interface between the substrate and the thin film often brings about a problem in device characteristic.

In order to remove the spontaneous oxide film formed on the surface of the silicon substrate, various techniques have been developed such as hydrogen reduction, high-vacuum annealing, silane reduction, and $GeN_4$ reduction. Application of these techniques to a treatment preceding the epitaxial growth of silicon and a treatment preceding the formation of the polysilicon contact are considered.

The epitaxial growth of silicon comprises the steps of cleaning the substrate, removing the spontaneous oxide film within the growing furnace, and growing an epitaxial film. Typically, the step of cleaning the substrate is carried out by the use of a mixed solution of $H_2O_2$, $NH_4OH$, and $H_2O$ heated to about 70° C. to remove contaminants on the surface of the substrate and to form the spontaneous oxide film which serves to protect the surface from contamination. Thereafter, the spontaneous oxide film is removed within the growing furnace by means of hydrogen reduction, silane reduction, or high-vacuum annealing. Then, the epitaxial film is deposited by low-pressure chemical vapor deposition (LPCVD) using a silane-based gas. Hydrogen reduction is carried out by heating the substrate to a temperature not lower than 1050° C. and supplying a hydrogen gas onto the surface of the substrate under an atmospheric pressure or a reduced pressure ranging from less than ten to several tens in Torr. This technique is one of the most popular techniques used in manufacturing an LSI circuit because the spontaneous oxide film on the surface of the substrate can relatively easily removed. High-vacuum annealing is used in a molecular beam epitaxy (MBE) apparatus with a high-vacuum chamber which can achieve a vacuum degree less than $1 \times 10^{-9}$ Torr. In high-vacuum annealing, the spontaneous oxide film is removed by heating the substrate at a temperature around 950° C. in a high vacuum less than $1 \times 10^{-9}$ Torr. However, in order to meet a demand for very fine devices following the recent development of highly integrated LSI circuits, it is required to lower the process temperature in each manufacturing process. As a technique of removing the spontaneous oxide film at a lower temperature, use is made of silane reduction comprising the steps of immersing the substrate in a diluted HF solution, rinsing the substrate by pure water, drying the substrate, introducing the substrate into the growing furnace, heating the substrate to a temperature around 800° C., and supplying a hydrogen-diluted 0.2% $SiH_4$ gas to thereby remove the spontaneous oxide film. In addition, $GeH_4$ reduction using a $GeH_4$ gas instead of $SiH_4$ gas is employed in the process of growing a $Si_xGe_{1-x}$ thin film. In $GeH_4$ reduction, the process temperature can be lowered down to 650° C. (for example, described in Japanese Unexamined Patent Publication No. 259091/1993).

Attention will now be directed to the formation of the polysilicon contact between the substrate and the conductor layer. In this case, a polysilicon thin film is deposited by LPCVD using a silane-based gas, after the spontaneous oxide film is removed by hydrogen reduction or silane reduction within the growing furnace in the manner similar to the case of epitaxial growth. Herein, the spontaneous oxide film need not be so completely removed as required in epitaxial growth but a partial removal will suffice because the decrease of contact resistance is a major object. Accordingly, the removal can be performed at a lower temperature as compared with the case of epitaxial growth. For example, after the removal at a substrate temperature not lower than 750° C. and 650° C. for hydrogen reduction and silane reduction, respectively, the contact resistance is effectively suppressed (for example, an article contributed to 1992 Spring Conference of Institute of Applied Physics Engineers in Japan, 30a-ZE-1).

As described above, the removal of the spontaneous oxide film on the surface of the substrate can be carried out by hydrogen reduction, high-vacuum annealing, silane reduction, and $GeH_4$ reduction. Since the temperature at removal must be lowered to meet the requirements for very fine devices, silane reduction and $GeH_4$ reduction become important because removal can be effected at a lower temperature than that required in hydrogen reduction or the high-vacuum annealing. However, silane reduction and the $GeH_4$ reduction have certain problems which will be described below.

In case of the epitaxial growth of silicon described in the above-mentioned Japanese Unexamined Patent Publication No. 259091/1993, a diluted HF solution is used in cleaning the substrate instead of the typical mixed solution of $H_2O_2$, $NH_4OH$, and $H_2O$. The use of diluted HF solution aims to suppress the formation of the spontaneous oxide film on the surface of the substrate before introduction of the substrate into the growing furnace and has an effect of lowering the temperature required in removing the spontaneous oxide film within the growing furnace. However, the use of diluted HF solution is disadvantageous in that residual carbon is present at the interface between the epitaxial film and the substrate and, as a consequence, the quality of the epitaxial film is deteriorated. Particularly when applied to the epitaxial film in a channel region of a very fine MOS-FET having a gate length not greater than 0.15 μm, a serious problem arises in device operation. This is because the film quality has a large influence upon the carrier mobility and the break-down voltage of a gate oxide film. In this connection, it is required to create a method of removing the spontaneous oxide film on the surface of the substrate by the use of a typical mixed solution of $H_2O_2$, $NH_4OH$, and $H_2O$ but at a lower temperature than in the prior art.

On the other hand, in case of the formation of the contact plug by the polysilicon film described in the above-mentioned article contributed to 1992 Spring Conference of Institute of Applied Physics Engineers in Japan, 30a-ZH-1, an irregularity is formed on the surface of the thin film which is deposited after the reduction. Presence of such irregularity constitutes a bar to achieving a further integrated ULSI circuit. In this respect, discussion will be made in detail in conjunction with the case of silane reduction. A similar discussion will apply to the case of $GeH_4$ reduction.

It is known that, in silane reduction, the spontaneous oxide film ($SiO_2$) on the substrate is minimized and removed by the use of silane ($SiH_4$) gas in accordance with the chemical reaction expressed by the following chemical formula (for example, the article contributed to 1992 Spring Conference of Institute of Applied Physics Engineers in Japan, 30a-ZH-1).

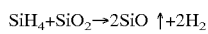
$SiH_4+SiO_2 \rightarrow 2SiO \uparrow +2H_2$

However, due to several reasons such as nonuniformity in thickness of the spontaneous oxide film on the surface of the substrate, the spontaneous oxide film can not simultaneously be removed throughout the surface of the substrate. Specifically, a thin portion of the spontaneous oxide film is at first removed so that the surface of the substrate has both a removed region where the oxide film is completely removed and a remaining region where the oxide film is still left. When the silane reduction is continued further, the removal progresses in the remaining region while the growth of the silicon thin film commences in the removed region where the oxide film is removed and the silicon substrate is exposed. Such simultaneous occurrence of the removal of the oxide film and the growth of the silicon thin film on the surface of the substrate results in irregularity of the surface of the silicon thin film. The step height of the irregularity depends on the conditions of the silane reduction and, for example, reaches a level of several tens of nanometers under the condition of 650° C. described in conjunction with the prior art.

Upon manufacturing the ULSI circuit, various problems arise as a result of presence of the irregularity of the surface of the silicon thin film. Description will be made as regards those problems in conjunction with the case of a polysilicon contact by way of example.

With the improvement of a highly-integrated semiconductor memory such as a DRAM, the diameter of the polysilicon contact also becomes smaller. For example, in the ULSI circuit according to a design rule at a level of 0.25 μm, a contact hole will have a diameter on the order of 100 nm and a height on the order of 1 μm. When the contact hole having such a high aspect ratio is buried by a polysilicon film, impurities can not sufficiently be introduced to the bottom of the contact hole if the contact hole is buried by non-doped polysilicon and the impurities are thereafter introduced by diffusion of phosphorus or ion implantation. Therefore, use is made of in-situ doping in which the impurities are doped simultaneously upon deposition of the polysilicon film. For example, the contact hole is buried by a phosphorus-doped or boron-doped polysilicon film by LPCVD using an $Si_4$—$PH_3$ gas or an $SiH_4$—$B_2H_6$ gas.

In case of using silane reduction in this process of burying the contact hole by a phosphorus-doped polysilicon film, the spontaneous oxide film at the bottom of the contact hole is removed by silane reduction before the contact hole is buried by the in-situ phosphorus-doped polysilicon film. However, in the above-mentioned conventional silane reduction, the silicon film is already grown during silane reduction to a thickness of several tens of nanometers. Thus, a major part of the contact hole having a diameter of 100 nm is inevitably buried by the non-doped polysilicon film. Even if the in-situ phosphorus-doped polysilicon film is grown after silane reduction, the average phosphorus concentration in the contact hole is decreased because of presence, of the non-doped polysilicon film. This results in an increase in polysilicon resistance. Also in case of boron doping, the polysilicon resistance is likewise increased.

In the above-mentioned case where the silicon epitaxial film is applied to the channel region of the MOS-FET, the break-down voltage of the gate oxide film of the MOS is deteriorated due to the irregularity of the surface of the epitaxial film.

As described above, conventional silane reduction and $GeH_4$ reduction have problems of film quality and surface irregularity. Thus, in the above-mentioned applications to the epitaxial film in the channel region and to the polysilicon contact plug, it is necessary to improve the results of hydrogen reduction or high-vacuum annealing that can be performed at low temperature as compared with the prior art.

For applications to those devices hardly affected by the quality of the epitaxial film or surface irregularity, the conventional silane or $GeH_4$ reduction is applicable. Even in this event, however, the temperature at reduction must be lowered because a low process temperature is essential.

SUMMARY OF THE INVENTION

It is therefore an object of this invention to provide a surface treatment method of a silicon substrate, which method is capable of removing a spontaneous film at a relatively low temperature.

It is another object of this invention to provide a surface treatment method of the type described, which method is capable of considerably lowering a temperature required in high-vacuum annealing, hydrogen reduction, silane reduction, or $GeH_4$ reduction.

According to this invention, there is provided a method for treating a substrate surface of a single crystal silicon substrate and which comprises the steps of: preliminarily implanting Ge ions into the substrate surface to form a Ge-implanted silicon film (that is, a $Si_xGe_{1-x}$ alloy film) on the single crystal silicon substrate; treating a film surface of the Ge-implanted silicon film to form a spontaneous oxide film which results from spontaneously oxidizing the film surface; and removing the spontaneous oxide film.

Typically, the treating step is for cleaning the film surface of the Ge-implanted silicon film by a heated cleaning solution to remove contaminants on the film surface of the Ge-implanted silicon film and to form the spontaneous oxide film which protects the film surface of the Ge-implanted silicon film from contamination.

The implanting step may comprise the steps of: forming a silicon oxide film on the substrate surface; implanting Ge ions through the silicon oxide film with injection energy providing a maximum Ge ion concentration on the substrate surface to form a Ge-implanted silicon film on the single crystal silicon substrate and removing the silicon oxide film.

Preferably, the spontaneous oxide film is removed by subjecting the spontaneous oxide film to a heat treatment in a reduced-pressure atmosphere.

More specifically, the spontaneous oxide film is subjected to a heat treatment in a reduced-pressure atmosphere not higher than $1\times10^{-9}$ Torr to remove the spontaneous oxide film. That is, the spontaneous oxide film is removed by high-vacuum annealing.

In these cases, the implanting step is preliminarily for implanting Ge ions into the substrate surface to form, on the single crystal silicon substrate, a Ge-implanted silicon film which consists, in atomic percent, essentially of at least 1% of Ge.

Alternatively, the removing step is for subjecting the spontaneous oxide film to a heat treatment with a reducing gas supplied onto the spontaneous oxide film to remove the spontaneous oxide film.

The reducing gas is one selected from the group consisting a hydrogen gas, a silane-based gas, and a $GeH_4$ gas. That is, the spontaneous oxide film is removed by the hydrogen reduction, the silane reduction or $GeH_4$ reduction.

In this case, the implanting step is preliminarily for implanting Ge ions into the substrate surface to form, on the single crystal silicon substrate, Ge-implanted silicon film which consists, in atomic percent, essentially of at least 1% of Ge.

The spontaneous oxide film formed on the surface of the Ge-implanted silicon film (that is, the $Si_xGe_{1-x}$ alloy film) is highly volatile and can be removed at a low temperature as compared with that formed on the surface of silicon. In view of the above, according to this invention, Ge ions are preliminarily implanted into the surface of the substrate. Immediately after implantation of Ge ions, an $Si_xGe_{1-x}$ alloy film in an amorphous phase is formed in the surface of the substrate. By subsequent heating of the substrate in the growing furnace, the amorphous alloy film is easily crystallized at a low temperature and transformed into a single crystal $Si_xGe_{1-x}$ alloy film. Simultaneously, an $Si_xGe_{1-x}$ oxide film, is formed on an uppermost surface. This oxide film, which is highly volatile, can readily be removed at a low temperature. Thus, the spontaneous oxide film on the surface of the substrate can be removed at a low temperature as compared with the prior art.

DETAILED DESCRIPTION OF THE INVENTION

Description will now be made as regards several preferred embodiments of this invention.

Figure 1:
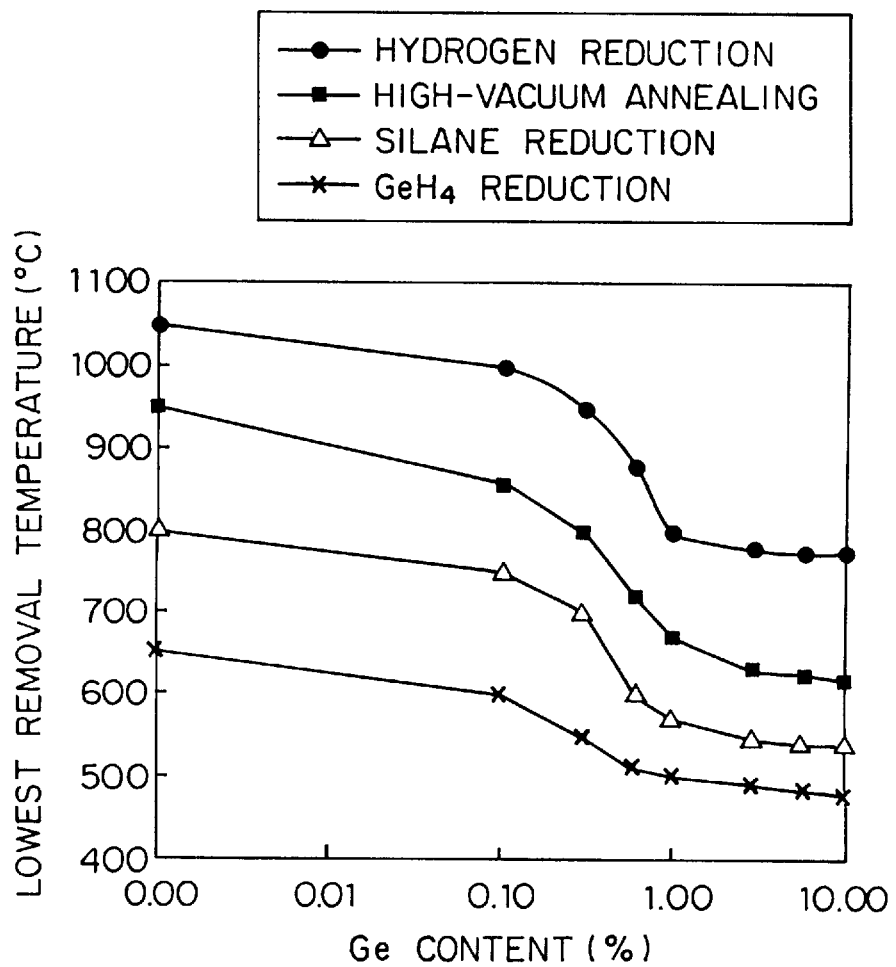
FIG. 1 is a graph showing the relationship between the content of Ge and the lowest temperature at which a spontaneous oxide film is removable in a first embodiment of this invention.

FIG. 1 shows the relationship between the content of Ge in an $Si_xGe_{1-x}(0<x<1)$ alloy film and the lowest removal temperature at which a spontaneous oxide film is removable. These data were collected by the use of a silicon substrate having a surface orientation of (100) with an $Si_xGe_{1-x}$ thin film formed thereon in a well-known manner by the use of an ultra high vacuum chemical vapor deposition (UHV-CVD) apparatus, The $Si_xGe_{1-x}$ thin film was formed under the conditions of a substrate temperature of 600° C., a vacuum in a growing furnace equal to $1\times10^{-3}$ Torr, an $Si_2H_6$ gas flow rate of 10 sccm (standard cubic centimeters per minute), and a $GeH_4$ gas flow rate varied between 0 and 10 sccm. Thus, the $Si_xGe_{1-x}$ film was formed with a variable content of Ge between 1 and 10%. After the $Si_xGe_{1-x}$ film was formed, the substrate was cleaned by the use of a mixed solution of $H_2O_2$, $NH_4OH$, and $H_2O$ to form a spontaneous oxide film on the surface of the substrate. The spontaneous oxide film was removed by hydrogen reduction, high-vacuum annealing, silane reduction, and $GeH_4$ reduction.

As shown in FIG. 1, it has been found that, in any one of the above-mentioned removing techniques, the lowest removal temperature is decreased with an increase of the content of Ge. It has also been confirmed that this decreasing effect is substantially saturated at the content of Ge around 1% in atomic percent.

Figure 2:
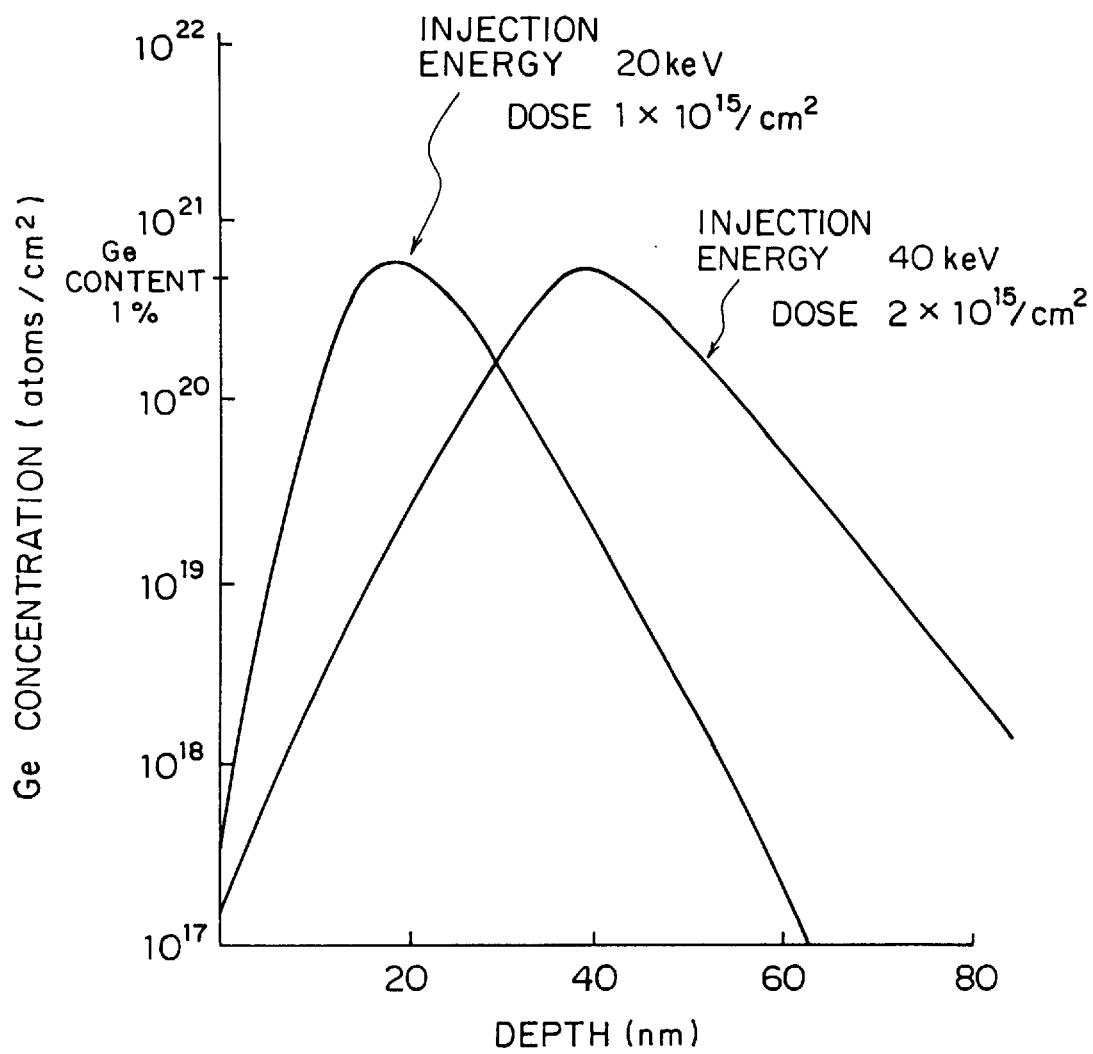
FIG. 2 is a graph showing the depth profile of the concentration of Ge with respect to the condition for Ge ion implantation in the first embodiment of this invention.

Fig, 2 shows the relationship between the condition for Ge ion implantation and the depth profile of the concentration of Ge measured by the secondary ion mass spectrometry (SIMS) after implantation. It is understood from FIG. 2 that, in either condition, the peak concentration of Ge exceeds 1% (atomic percent) in content of Ge. The depth profile of Ge is varied by diffusion of Ge upon annealing the substrate. However, through observation of the spontaneous oxide film after annealing by the X-ray photoelectron spectroscopy (XPS), it has been confirmed that the content of Ge incorporated into the spontaneous oxide film formed on the surface is substantially coincident with the content of Ge upon implantation.

Based on the above-mentioned fundamental experiments, trials were made to remove the spontaneous oxide film formed on the surface of the substrate. Description will hereafter be made in conjunction with the several embodiments.

First Embodiment

On a silicon substrate having a surface orientation of (100), a thermal oxide film was formed to a thickness of 20 nm by the use of an electric furnace. Then, with reference to FIG. 2, Ge ions were implanted into the substrate through the oxide film under the conditions of injection energy of 20 keV and a dose of $1\times10^{15}/cm^2$. Thereafter, the oxide film was removed by the use of a 1% diluted HF solution. The substrate was cleaned by the use of a cleaning solution of, for example a mixed solution of $H_2O_2$, $NH_4OH$, and $H_2O$ heated to around 70° C. to remove contaminants on the surface of the substrate and to form a spontaneous oxide film which served to protect the surface from contamination. Subsequently, the substrate was rinsed by pure water for five minutes, dried by a spindrier, and introduced into a loadlock chamber of an UHV-CVD apparatus. After the substrate was conveyed into a growing furnace, the substrate was annealed in a high vacuum not higher than $1\times10^{-9}$ Torr at a substrate temperature of 650° C. for five minutes. Then, an $Si_2H_6$ gas is supplied at the flow rate of 10 sccm at the same temperature to grow a silicon epitaxial film.

Figure 3:
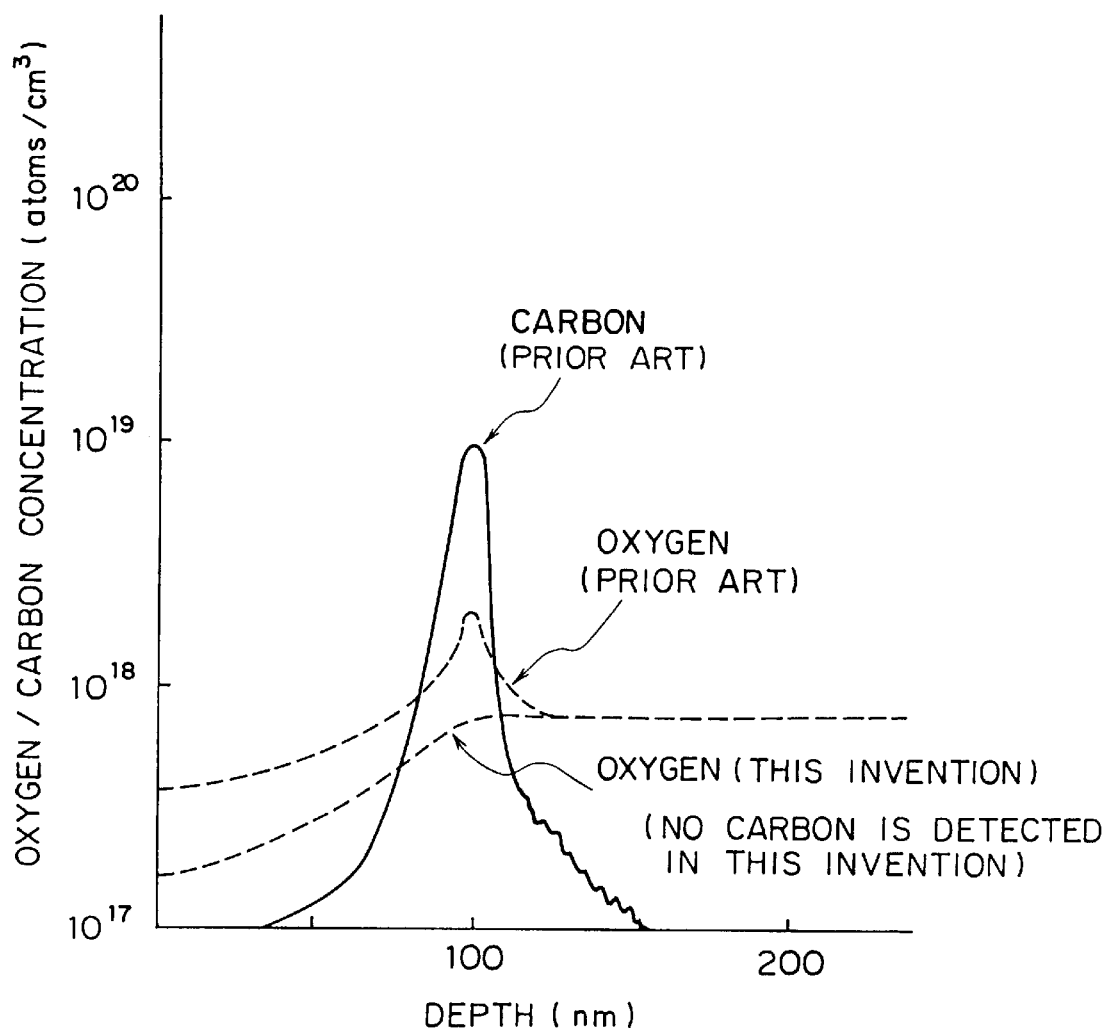
FIG. 3 is a graph showing the concentrations of oxygen residue and carbon residue at the interface between an epitaxial film and a substrate in the first embodiment of this invention.

FIG. 3 shows the result of SIMS measurement on the amount of impurities at an interface between the epitaxial film and the substrate. It will be understood that oxygen and carbon concentrations at the interface were considerably decreased as compared with the case where the epitaxial film is grown in the conventional process including the cleaning by the diluted HF solution and the GeH$_4$ reduction at 640° C. Observation was carried out of the interface in section by the use of a transmission electron microscope. As a result, no crystal defect was observed at the interface according to this invention while stacking fault was observed at the interface according to the conventional process.

Second Embodiment

Next, description will proceed to the case where this invention was applied to the formation of a polysilicon film.

As described in conjunction with the prior art, a silicon substrate was immersed in a diluted HF solution, rinsed by pure water, and dried. Then, the substrate was subjected to heat treatment at a substrate temperature of 800° C. in a hydrogen-diluted SiH$_4$ gas atmosphere. Thus, a spontaneous oxide film on the surface of the substrate was removed.

As described in conjunction with the prior art, the spontaneous oxide film can not simultaneously be removed throughout the surface of the substrate due to various reasons such as nonuniformity in thickness of the spontaneous oxide film on the surface of the silicon substrate. Thus, the surface of the substrate has both a removed region where the oxide film is completely removed and a remaining region where the oxide film is still left.

According to this invention on the other hand, the removal temperature can be lowered, even in a hydrogen reduction, to 800° C. which is equivalent to that of a conventional silane reduction. Specifically, in the manner similar to the first embodiment, a thermal oxide film was formed on a silicon substrate having a surface orientation of (100) to a thickness of 20 nm by the use of an electric furnace. Then, with reference to FIG. 2, Ge ions were implanted into the substrate through the oxide film under the conditions of injection energy of 20 keV and a dose of $1 \times 10^{15}/\text{cm}^2$. Thereafter, the oxide film was removed by the use of a 1% diluted HF solution. The substrate was cleaned by the use of a mixed solution of H$_2$O$_2$, NH$_4$OH, and H$_2$O heated to around 70° C. to remove contaminants on the surface of the substrate and to form a spontaneous oxide film which served to protect the surface from contamination. Subsequently, the substrate was rinsed by pure water for five minutes, dried by a spindrier, and introduced into a typical LPCVD apparatus. Then, the substrate was subjected to heat treatment at a substrate temperature of 800° C. in a hydrogen atmosphere for five minutes to remove the spontaneous oxide film on the surface of the substrate. Thereafter, an amorphous silicon film was deposited in the same furnace at a substrate temperature of 580° C. and a vacuum degree of 1 Torr with an SiH$_4$ gas supplied at a flow rate of 1000 sccm. Subsequently, heat treatment was carried out in a nitrogen atmosphere at a temperature of 800° C. for 60 minutes by the use of an electric furnace. Thus, a polysilicon film is obtained.

For the polysilicon films formed in the above-mentioned conditions and formed by the conventional process, surface irregularities were measured by the use of an atomic force microscope (AFM). As a result, the surface irregularity of about 25 nm was measured for the conventional process. On the other hand, a flat surf ace having a surface irregularity not greater than 2 nm was obtained according to this invention. In addition, the amount of carbon at the interface between the polysilicon film and the substrate was measured by the SIMS. As a result, it has been confirmed that, according to this embodiment, the interfacial carbon was completely removed like in the first embodiment.

Third Embodiment

In this embodiment, the method of forming a polycrystalline silicon film in the second embodiment was applied to the formation of a polysilicon contact of a dynamic random access memory (DRAM).

Figure 4A:
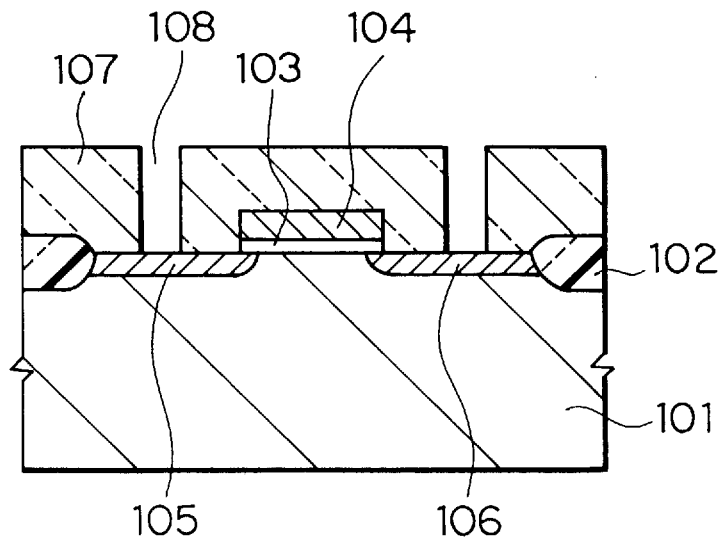
FIGS. 4(A) and 4(B) are sectional views for describing a process of manufacturing a DRAM according to a third embodiment of this invention.
Figure 4B:
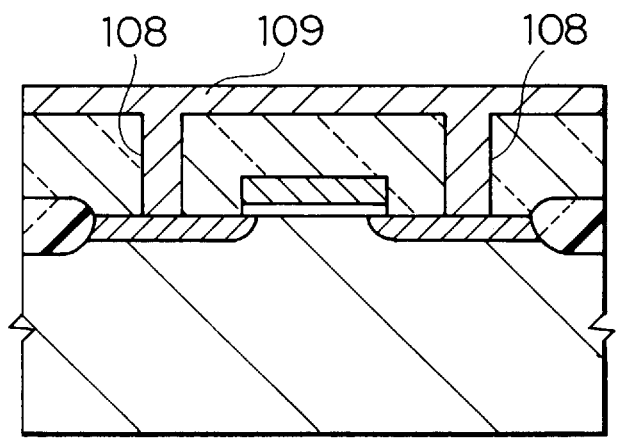

On a silicon substrate 101 having a surface orientation of (100) and a resistivity of 10Ω·cm, a field oxide film 102 was formed by local oxidation of silicon (LOCOS) known in the art, as illustrated in FIG. 4 (A). Then, a gate oxide film 103 and a gate electrode 104 were formed in the substrate 101. Furthermore, a source diffusion layer 105 and a drain diffusion layer 106 were formed. Thus, a device portion of a switching transistor was completed. After an interlayer insulator film 107 was formed by chemical vapor deposition (CVD), contact holes (each having a diameter of 0.1 μm and a height of 1 μm) 108 were formed to be connected to the diffusion layers 105 and 106.

As described in conjunction with the second embodiment, a thermal oxide film was formed to a thickness of 20 nm. Then, Ge ions were implanted into the substrate through the oxide film under the conditions of injection energy of 20 keV and a dose of $1 \times 10^{15}/\text{cm}^2$. Thereafter, the oxide film was removed by the use of a 1% diluted HF solution. The substrate was cleaned by the use of a mixed solution of H$_2$O$_2$, NH$_4$OH, and H$_2$O heated to around 70° C. to remove contaminants on the surface of the substrate and to form a spontaneous oxide film which served to protect the surface from contamination. Subsequently, the substrate was rinsed by pure water for five minutes, dried by a spindrier, and introduced into a typical LPCVD apparatus. Then, the substrate was subjected to heat treatment at a substrate temperature of 800° C. in a hydrogen atmosphere for five minutes to remove the spontaneous oxide film on the surface of the substrate at the bottom portion of each contact hole 108. Subsequently, an SiH$_4$ gas and a PH$_3$ gas were supplied under the conditions of a temperature of 550° C., a partial pressure ratio PH$_3$/SiH$_4$ of $1 \times 10^{-3}$, and a total pressure of 0.2 Torr to grow a phosphorus-doped amorphous silicon film 108 to a thickness of 50 nm. Thus, the contact holes 108 were buried with the amorphous silicon film. Furthermore, heat treatment was carried out at a temperature of 850° C. for 30 minutes to crystallize the amorphous silicon film. Simultaneously, phosphorus atoms were activated to form a phosphorus-doped polysilicon film 109 (FIG. 4(B)). Finally, a DRAM was completed by a known process.

The contact plug formed by the above-mentioned method of this invention had no spontaneous oxide film at the interface between the substrate and the polysilicon contact plug. In addition, a sufficient amount of electrically active phosphorus atoms were present in the polysilicon film to serve as the contact plug. As a consequence, the contact resistance (substrate/plug interface resistance+plug resistance) was considerably decreased. For example, the interface resistance at the interface between the substrate and the contact plug was decreased to an approximate half (corresponding to 75% decrease of the contact resistance) of that when the contact plug is formed without the silane reduction. As compared with the plug resistance in case where the spontaneous oxide film is removed by the conventional silane reduction, the plug resistance was suppressed in this invention to approximate ⅕ (corresponding to 60% decrease of the contact resistance).

Fourth Embodiment

Referring to FIGS. 5(A) through 5(D), description will be made as regards an embodiment in which this invention was applied to a elevated or raised film serves to shallow a junction depth in the source and drain regions of a very fine MOS-FET.

Figure 5A:
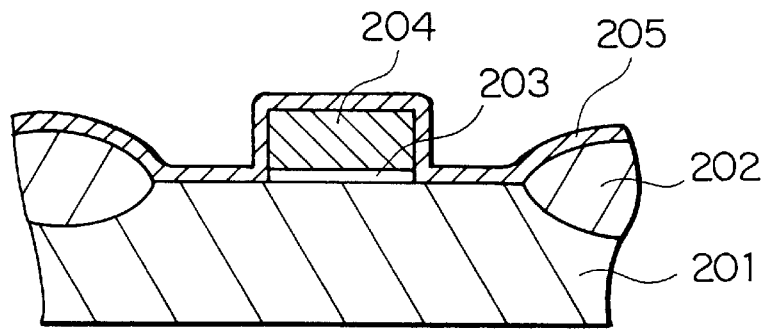
FIGS. 5(A) through 5(D) are sectional views for describing a process of manufacturing a MOS-FET according to a fourth embodiment of this invention.
Figure 5B:
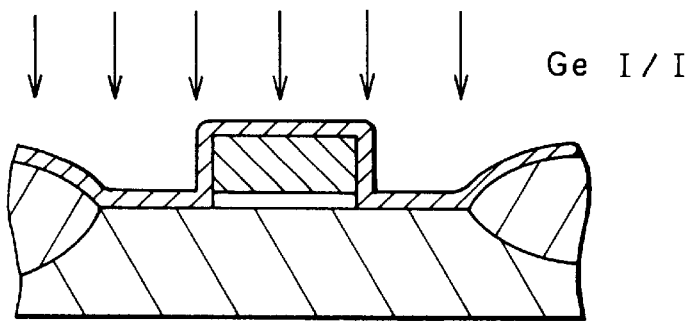
Figure 5C:
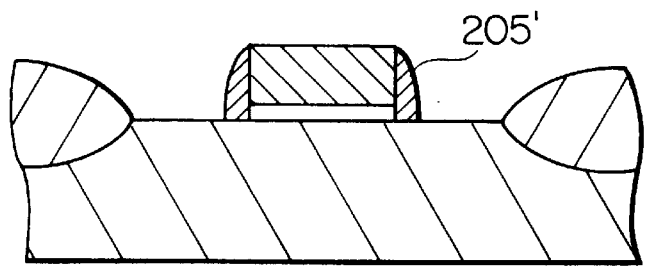
Figure 5D:
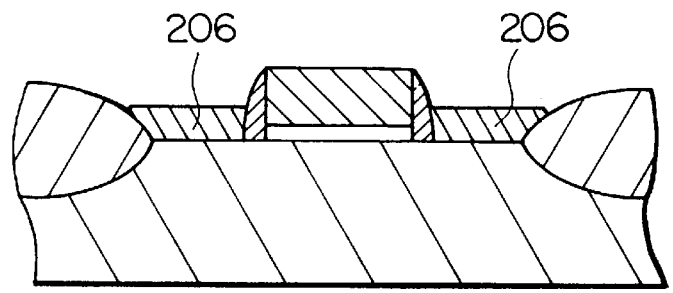

At first, on a P-type silicon substrate 201 having a surface orientation of (100) and a resistivity of 10Ω·cm, a field oxide film 202 was formed by the LOCOS. Then, a gate oxide film 203 and a gate electrode 204 were formed. Next, by the use of a typical LPCVD apparatus, a CVD oxide film 205 was formed to a thickness of 20 nm (FIG. 5(A)). Thereafter, as illustrated in FIG. 5(B), Ge ions were implanted into the P-type silicon substrate 201 through the CVD oxide film 205 under the conditions of injection energy of 20 keV and a dose of $1 \times 10^{15}/cm^2$. As illustrated in FIG. 5(C), the CVD oxide film 205 was etched by dry etching to remove the CVD oxide film 205 in the source and the drain regions and to leave the oxide film on gate sidewalls 205'. The substrate was cleaned by the use of a mixed solution of $H_2O_{2, NH_4}OH$, and $H_2O$ heated to around 70° C. to remove contaminants on the surface of the substrate and to form a spontaneous oxide film which served to protect the surface from contamination. Subsequently, the substrate was rinsed by pure water for five minutes, dried by a spindrier, and introduced into a loadlock chamber of a UHV-CVD apparatus. After the vacuum degree of $1 \times 10^{-6}$ Torr or less was reached, the substrate is transferred into a growing chamber. After the vacuum degree within the growing chamber reached $1 \times 10^{-9}$ Torr or less, the substrate was heated to a temperature of 650° C. to remove the spontaneous oxide film. At the same temperature, an $Si_2H_6$ gas was supplied at a flow rate of 10 sccm to selectively grow a silicon epitaxial film 206 only in the source and the drain regions (FIG. 5 (D)) Subsequently, source and drain diffusion layers were formed by a known technique to obtain an MOS device.

It has been confirmed that, as compared with the film formed by the conventional process, the epitaxial film formed in the source and the drain regions under the above-mentioned conditions was free from carbon contamination at the interface between the film and the substrate and is excellent in crystallinity. In case of the conventional process, a large amount of carbon is present at the interface between the film and the substrate and, as a result, crystal defect is observed at the interface.

Although this embodiment was directed to the high-vacuum annealing and the hydrogen reduction, use may be made of silane reduction or $GeH_4$ reduction for those processes which are not affected by the irregularity of the film surface and film quality. In this case, the removal temperature can considerably be lowered as compared with a conventional process, as described in conjunction with the first embodiment.

Although this embodiment was described in conjunction with the implantation of Ge ions through the oxide film, Ge ions may be implanted directly into the substrate not through the oxide film. In such case, the steps of forming the oxide film and removing the oxide film can be omitted. However, in order to assure that the content of Ge in the surface of the substrate is 1% or more, the dose must be increased to an at least one digit higher level.

As mentioned above, according to this invention, it is possible to lower the removal temperature for removing the spontaneous oxide film by high-vacuum annealing, hydrogen reduction, silane reduction, or $GeH_4$ reduction. In addition, the film quality of the silicon epitaxial film is excellent. Furthermore, the contact resistance of the poly-silicon contact plug can be suppressed.

What is claimed is:

1. A method of treating a substrate surface of a single crystal silicon substrate, comprising the steps of:

preliminary implanting Ge ions into said substrate surface to form, on said single crystal silicon substrate, a Ge-implanted silicon film which comprises, in atomic percent, at least 1% Ge;

treating the surface of said Ge-implanted silicon film to oxidize the Ge-implanted silicon film so as to form a spontaneous oxide film thereon which is (1) highly volatile as compared to the Ge-implanted silicon film formed at the surface of the substrate and, thus, (2) readily removable at a low temperature as compared with the film formed at the surface of the silicon substrate; and removing said resulting highly volatile spontaneous oxide film.

2. A method as claimed in claim 1, wherein said treating step comprises cleaning the surface of said Ge-implanted silicon film by means of a heated cleaning solution so as to remove contaminants on the film surface of said Ge-implanted silicon film and form said volatile spontaneous oxide film which serves to protect the surface of said Ge-implanted silicon film from contamination.

3. A method as claimed in claim 1, wherein said implanting step comprises the steps of:

forming a silicon oxide film on said substrate surface;

implanting sad Ge ions through said silicon oxide film with injection energy providing a maximum Ge ion concentration on said substrate surface to form said Ge-implanted silicon film on said single crystal silicon substrate; and removing said silicon oxide film.

4. A method as claimed in claim 1, wherein said removing step comprises subjecting said spontaneous oxide film to a heat treatment in a reduced-pressure atmosphere to remove said volatile spontaneous oxide film.

5. A method as claimed in claim 4, wherein said implanting step implants said Ge ions into said substrate surface to form, on said single crystal silicon substrate, a Ge-implanted silicon film which consists, in atomic percent, essentially of at least 1% Ge.

6. A method as claimed in claim 4, wherein said removing step comprises subjecting said volatile spontaneous oxide film to heat treatment in a reduced-pressure atmosphere not higher than $1 \times 10^{-9}$ Torr to remove said volatile spontaneous oxide film.

7. A method as claimed in claim 6, wherein said implanting step implants said Ge ions into said substrate surface to form, on said single crystal silicon substrate, a Ge-implanted silicon film which consists, in atomic percent, essentially of at least 1% of Ge.

8. A method as claimed in claim 1, wherein said removing step comprises subjecting said volatile spontaneous oxide film to a heat treatment with a reducing gas supplied onto said volatile spontaneous oxide film to remove said spontaneous oxide film.

9. A method as claimed in claim 8, wherein said reducing gas comprises a gas selected from the group consisting of a hydrogen gas, a silane-based gas, and a $GeH_4$ gas.

10. A method as claimed in claim 8, wherein said implanting step comprises implanting said Ge ions into said substrate surface to form, on said single crystal silicon substrate, a Ge-implanted silicon film which consists, in atomic percent, essentially of at least 1% of Ge.

* * * * *